Jan. 26, 1943. E. MITTELMANN Re. 22,258

HIGH FREQUENCY WATTMETER

Original Filed April 22, 1938

Inventor
Eugen Mittelmann
By George I. Haight
Atty.

Reissued Jan. 26, 1943

Re. 22,258

UNITED STATES PATENT OFFICE 22,258

HIGH FREQUENCY WATTMETER

Eugen Mittelmann, Chicago, Ill.

Original No. 2,240,955, dated May 6, 1941, Serial No. 203,661, April 22, 1938. Application for reissue May 6, 1942, Serial No. 441,921. In Austria April 26, 1937

15 Claims. (Cl. 171—95)

This invention relates to a method of and an apparatus for measuring the power which is absorbed by the load only in the output circuit of a high frequency generator.

While my invention is applicable to the measurement or determination of the power absorbed by any load in the output circuit of a high frequency generator, the invention has special application to the determination of power absorbed by a patient from the output circuit of a short wave or high frequency therapy machine.

An object of my invention is to provide a method of and apparatus for the measurement or determination of the load component of the total power output of an oscillatory circuit, which component may be referred to as that portion of the total power output which is actually used to energize the load, as distinguished from those portions of the total power output which constitute power losses in, or radiation losses from, the circuit or apparatus. In the application of short wave therapy, only a fraction of the total high frequency power output of the apparatus is absorbed by the patient undergoing treatment, and the remainder is lost through radiation, leakage, etc. Known measuring devices with which I am familiar indicate merely the total power output of the output circuit, in which is included the heating device or electrodes.

An object of my invention is, accordingly, to measure the power absorbed by the patient independently of the total power output of the circuit.

Other objects and advantages of my invention will be readily understood by reference to the accompanying drawing, wherein is illustrated diagrammatically the output circuit of a short wave or high frequency generator embodying my invention.

Referring to the accompanying drawing—

Figure 1:
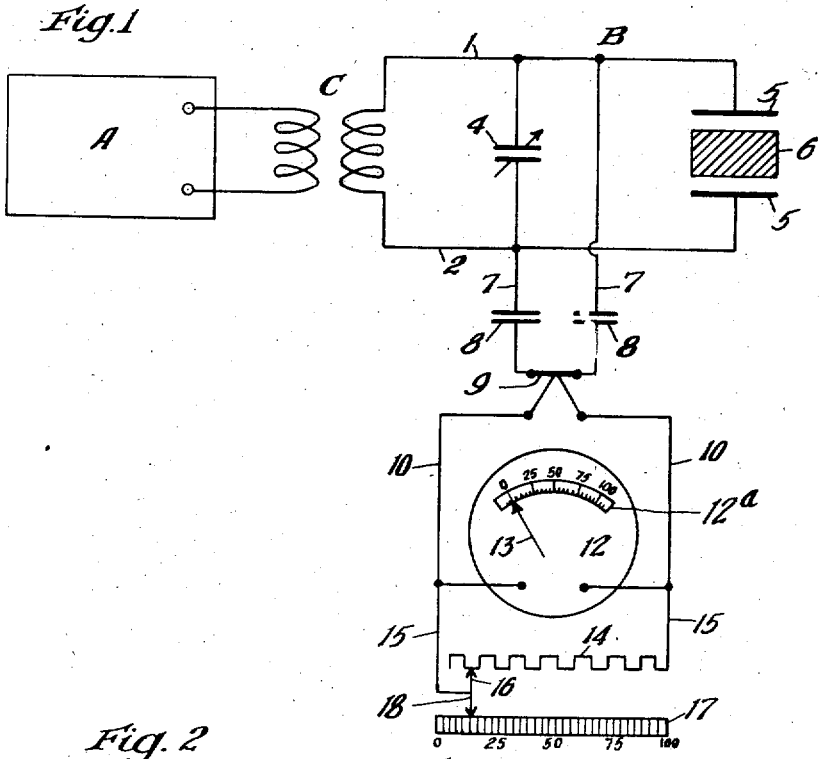
Figure 2:
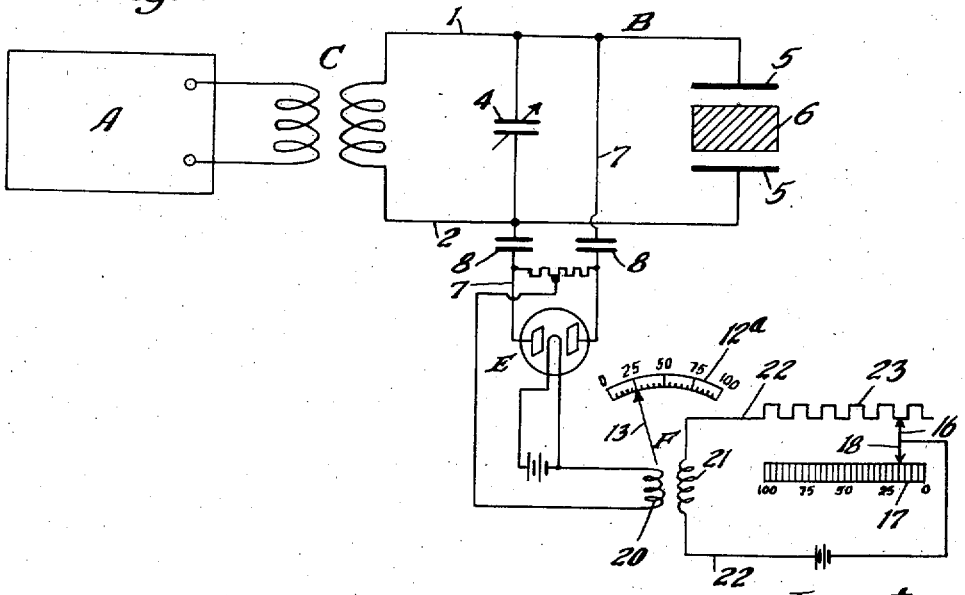

Figure 1 is a diagrammatic view of the secondary or output circuit of a high frequency generator, showing the instrumentalities which I utilize in carrying out my invention; and Figure 2 is a similar view to Figure 1 in which a modified form of instrumentality is utilized.

In both of the figures of the drawing, A represents a source of high frequency oscillations coupled to a secondary or output circuit B by means of a transformer C, all in a manner well known in the art. The apparatus forming the source A of high frequency may be of any type well known and suitable for the purpose, since my invention is not concerned with the construction of that apparatus.

The resonance output circuit B is shown as including conductors 1 and 2 connecting the secondary of the transformer C with suitable electrodes 5 which are spaced apart, and between which the object 6 is positioned. The object 6 represents a load, absorbing power from the output circuit B. It is the power absorption of this load or object which is to be measured.

If the high frequency is to be applied as treatment to a patient, then it is to be understood that the object 6 is intended to represent the patient's body or some portion thereof positioned between the electrodes, as is well known and generally understood in this art. The output circuit in apparatus of this character generally has a variable condenser 4 bridged across the circuit for the purpose of tuning the circuit to resonance.

The effect of placing a patient's body, or some portion thereof, between the electrodes is in effect the coupling, or connecting into the secondary circuit of additional reactive and resistive elements, capable of absorbing power from the secondary circuit. It is understood, of course, that other power absorbing elements already exist in the circuit and are inherent thereto as characteristics thereof.

In accordance with my invention, I utilize a measuring instrument which operates on the principle of the square law, that is, in which the deflection of the pointer is proportional to the square of the voltage or current. Any standard or well known device of this type may be utilized. That which is shown in Figure 1 is of the hot wire thermocouple and galvanometer type, while that shown in Figure 2 is of the dynamometer type having a moving coil and an exciting coil and utilized in connection with an electronic tube operating in the square portion of its characteristic.

In Figure 1 the thermocouple 9 is bridged across the output circuit conductors 1 and 2 by means of conductors 7—7, which include the condensers 8—8.

The thermocouple 9 is connected to the terminals of the galvanometer 12 by means of conductors 10—10 in the usual manner in instruments of this character. The galvanometer 12 has a pointer 13 which moves over a calibrated dial 12a, the deflection of the pointer being proportional to the square of the voltage across the condenser 4, or the load in parallel therewith. This dial is calibrated in equal divisions, and, in the present instance, I have shown the dial as calibrated in divisions from 0 to 100.

In accordance with my invention, I provide a shunt circuit around the galvanometer, which shunt circuit includes a variable resistance 14 for varying the sensitivity of the galvanometer. This shunt circuit includes the conductors 15 which are connected to the terminals of the galvanometer. One of these conductors is connected to a terminal of the resistance 14 and the other is connected to a contact member or wiper 16 movable over the resistance 14. Alongside the path of the wiper 16 is a scale or dial 17 which is preferably calibrated in divisions from 0 to 100, corresponding to the dial of the galvanometer. The wiper carries a pointer 18 which cooperates with the dial 17 to indicate the resistance values in terms of the galvanometer readings.

Since it is desired that the shunt resistance 14 vary the sensitivity of the galvanometer in certain mathematical ratios, as will hereinafter be explained, it is necessary to first calibrate the dial 17 of the resistance in accordance with those ratios rather than in terms of the true values of the resistance 14. This resistance is so calibrated, as will hereinafter appear, that when the wiper 16 is moved to a point such that the pointer 18 indicates the same value as that indicated by the galvanometer 12, the sensitivity of the galvanometer will be of the value required to cause the galvanometer to indicate the true value of the power absorbed by the body or load 6. It will be seen from latter discussions that the resistance is conveniently constructed in such a manner that the ohmage gradient thereof will permit use of a dial 17 having linear divisions.

The principle upon which the measurement of the power absorbed by the object is accomplished by the above described apparatus may be explained as follows:

The secondary resonance circuit B (of Figure 1) under no load and load conditions may be denoted by two equivalent circuits, respectively, as follows: (1) a source of high frequency voltage in series with a simple coil and a variable condenser and having a single resistance $R_0$ in parallel with the condenser; and (2) the same circuit with a second resistance $R_1$ in parallel with the resistance $R_0$. The resistance $R_0$ may be defined as that resistance in parallel with the condenser which causes a power loss equal to the no load losses of the circuit, and the resistance $R_1$ may be defined as that resistance in parallel with the condenser which absorbs an amount of power equal to the power absorbed by the load or object. The variable condenser of this equivalent circuit is, of course, equivalent in all respects to the capacity represented by the electrodes 5—5 (in Figure 1) shunted by the variable condenser 4, and other contributory capacitive factors inherent in the circuit. The inductance represents all inductive reactances present as part of the characteristics thereof.

The first equivalent circuit represents the secondary circuit B with no load, or the object 6 not in position between the electrodes 5—5. Under these no load conditions there are certain losses in and from the circuit B, i. e., leakage losses, radiation losses, etc., all of which absorb power from the circuit.

Since the circuit is at resonance and all reactive factors or reactances are balanced, the total power absorbed at no load is a function of the equivalent parallel resistance $R_0$. $R_0$ is, of course, a constant for any given arrangement and spacing of the electrodes. The resonance voltage in the secondary circuit, i. e., across the variable condenser, under no load, is $e_0$, and the relation between $e_0$ and $R_0$ is:

$$e_0 = k.R_0 \qquad (1)$$

where $k$ is a factor of proportionality dependent upon the resonance frequency, the capacitance or inductance, and the value of the high frequency source of voltage, and represents the current through the equivalent resistance $R_0$. From this equation it will be evident that the resonance voltage of the circuit at no load is proportional to the equivalent parallel circuit-loss resistance $R_0$ of the circuit.

When a load or object is introduced into the circuit between the electrodes 5—5, additional reactive and resistive elements are coupled into the circuit. The circuit is once more tuned to resonance to compensate for the change in reactance of the circuit effected by the addition of the load, or the insertion of the object. The resonance voltage of the circuit is thereby changed from $e_0$ to a new value $e_1$. The resistance introduced into the circuit by the addition of the load or the introduction of the body 6 may, as previously noted, be represented by the equivalent parallel load resistance $R_1$. The voltage and frequency of the source being constant, and the capacitance of the circuit having been kept constant by the adjustment of the condenser to tune the circuit to the same resonance frequency, i. e., the frequency of the source or generator, the resonance voltage $e_1$ of the circuit is proportional to the combined resistance of the equivalent parallel resistance $R_0$ and $R_1$, according to the following equation:

$$e_1 = k \cdot \frac{R_0 R_1}{R_0 + R_1} \qquad (2)$$

From the above two equations, it will be seen that $$R_1 = R_0 \cdot \frac{e_1}{e_0 - e_1} \qquad (3)$$

For any given electrodes, the spacing within certain limits, which are rarely exceeded in practice, will not, at the high frequency used, alter or have any effect upon the equivalent no load resistance $R_0$.

By accurate control of the voltage of the source of high frequency, either manually, or by voltage stabilizer, or by any other method, the no load resonance voltage may be maintained constant for any given no load circuit conditions. Thus, with $e_0$ constant and $R_0$ constant, Equation 3 becomes:

$R_1 = f(e_1)$ or $R_1$ is purely a function of $e_1$ (4)

Keeping this in mind, and recalling that the power absorbed by $R_1$ is that which is to be determined, it can be seen that if we can measure the resonance voltage of the circuit under load, and if we know the equivalent parallel resistance added to the circuit by the introduction of the load, we can determine the power absorbed by the load by the well known power equation:

$$P = E^2 \cdot \frac{1}{R} \qquad (5)$$

where E is in volts, R is in ohms, and P is in watts.

Since $e_1$ is a direct function of $R_1$ when the no load resonance voltage and no load circuit conditions are maintained constant, then under those conditions the equivalent parallel resistances of the different loads will be determined by the values of $e_1$.

According to Equation 3, $R_1$ is proportional to the ratio of any load voltage $e_1$ to the difference between any no load voltage $e_0$ and said load voltage $e_1$. Since Equation 3 holds true for any no load resonance voltage and any no load circuit conditions and the ratio is a constant for any given load, the equivalent parallel load resistance $R_1$ will be a constant for any given load. The change in resonance voltage from any no load voltage $e_0$ to any load voltage $e_1$ will, accordingly, determine the value of the equivalent parallel load resistance $R_1$ for any given load introduced into the circuit.

Every change in the amount of power supplied to the secondary circuit B so changes both the no load and the load voltages, that the conditions of Equation 3 are always met. Hence, if we adjust resistance 14 to a value which will render the sensitivity inversely proportional to $R_1$ determined by Equation 3, the galvanometer will indicate the power absorbed by the load in accordance with Equation 5. The resistance 14 having been adjusted to this corresponding value, the galvanometer, if calibrated in power units, will indicate the power absorbed by the same load for any value of power supplied by the high frequency source—this measurement of the power absorption being, of course, limited only by the range of the galvanometer.

It is to be understood that the value of the equivalent parallel load resistance $R_1$ for each load need not be actually measured or known, and that the no load resonance voltage $e_0$ and the resonance load voltage $e_1$ need not be measured directly or in absolute voltage values. All that is necessary is to determine by measurement, in a manner to be described hereinafter, the ratios or quantities affecting the setting of the resistance 14 for any given load. The import of this is that the measurement of the power absorbed by the load or body 6 becomes a simple expedient. By merely determining, from the change in the resonance voltage caused by the addition of a given load to the circuit, the ratio corresponding to $R_1$, we can, if we know any resonance voltage E applied to the given load under the same electrode or circuit conditions, determine the power absorbed by that given load for any amount of power input. This can be seen from a simple use of the power Equation 5 which becomes $$P_1 = E^2 \cdot \frac{1}{R_1} \qquad (6)$$

where $P_1$ is the power absorbed by the load or body 6 at any resonance load voltage E and $R_1$ is the equivalent parallel resistance of the given load and is constant for that given load.

All measurements contemplated by my invention are made in practice by means of a hot wire thermocouple circuit operating in conjunction with a D. C. galvanometer or any similar square law measuring device.

In the galvanometer 12, the deflection $\delta$ represented by the pointer 13 thereof is proportional to the voltage measured and the sensitivity of the galvanometer or $$\delta = K_g . E_g . \sigma \qquad (7)$$

where $\delta$ is the deflection; $K_g$ is a galvanometer constant which is dependent upon the physical constants of the galvanometer; $E_g$ is the voltage across the galvanometer and $\sigma$ is the sensitivity of the galvanometer. $R_1$ is a direct function of $e_1$ (Equation 4), and is a constant quantity representing the ratio of the change in resonance voltage caused by the insertion of a load to the resonance load voltage. If we adjust the sensitivity $\sigma$ of the galvanometer after introduction of the load so that the sensitivity is proportional to the reciprocal of the equivalent parallel resistance of the load, as indicated by the following equation:

$$\sigma = K' \cdot \frac{1}{R_1} \qquad (8)$$

where K' is a factor of proportionality, then by substituting for $\sigma$ in Equation 7, the value of $\sigma$ determined by Equation 8, we obtain:

$$\delta = K' \cdot K_g \cdot \frac{E_g}{R_1} \qquad (9)$$

The voltage $E_g$ applied to the galvanometer is proportional to the square of the resonance voltage E of the circuit, or $$\delta = K_d \cdot \frac{E^2}{R_1} \qquad (10)$$

where $K_d$ is a factor of proportionality including K', $K_g$, and a factor of proportionality between $E_g$ and $E^2$.

It can be seen by comparing Equation 10 with Equation 6 that the deflection of the galvanometer is directly proportional to $P_1$, the power absorbed by the load. All that remains, therefore, is to calibrate the galvanometer in terms of power units, i. e., watts, and to calibrate the scale 17 of the resistance 14 in such manner that upon adjustment it will cause the sensitivity of the galvanometer to be $$\frac{1}{R_1}$$

for any given resonance load voltage E.

The mechanical procedure of determining the values of the resistance 14, for any given setting is no part of this invention, but it suffices to state that the equation for shunting galvanometers to alter the sensitivity thereof may be used for calculation; that is, for any desired value of $$\sigma = \frac{1}{R_1} \qquad (11)$$

the resistance of the shunt could be determined from the following equation:

$$\sigma = \frac{R_g + R_s}{R_s} \qquad (12)$$

where $R_g$ is the resistance of the galvanometer, $R_s$ is the resistance of the shunt and $\sigma$ is the sensitivity factor of the galvanometer.

Since $R_1$ for different loads is a direct function of $e_1$ (assuming constant no load resonance voltage and no load circuit conditions) the proper sensitivity control setting of the resistance 14 for a particular load can be determined by adjustment of the voltage $e_0$ to the same value under any no load circuit condition and then noting the reading corresponding to the resonance load voltage $e_1$ as indicated by the galvanometer after the load has been introduced and the secondary output circuit B retuned.

According to Equation 3, $R_1$ is always proportional to the ratio $$\frac{e_1}{e_0 - e_1} \qquad (13)$$

and $R_1$, as will be evident from Equations 11 and 12, is always proportional to $$\frac{R_s}{R_g + R_s} \qquad (14)$$

and, since $R_g$ is a constant, the relation of the settings of the resistance $R_s$ to the resonance load voltages may be properly determined from a measurement of the variation in resonance voltage from any no load value $e_0$ to any load value $e_1$ for a known load. Advantage is taken of this fact in calibrating the scale 17, as will now be described. In practice a maximum value of $R_s$ is chosen to correspond to the no load condition; thus decreasing values of $R_s$ will correspond to increasing values of equivalent parallel loss conductance $$\frac{1}{R_1}$$

The procedure in calibrating the resistance 14 is as follows:

The equivalent parallel resistance $R_0$, representing the circuit resistance without a load or object between the electrodes, is first determined in terms of the resonance voltage $e_0$. This is done by tuning the secondary output circuit B to resonance by means of variable condenser 4. The galvanometer will indicate a maximum voltage, which by suitable input control means, for instance, means varying the anode voltage of the oscillating tubes of the generator, is adjusted so that the pointer 13 is deflected to the full scale reading which, for illustration, we will assume to be 100. This reading of the meter corresponds to, or is indicative of, $e_0$. The resistance 14 being maximum, the scale 17 is marked zero (0). A calibrating load is then placed between the electrodes and the circuit is again tuned to resonance by the condenser 4. The actual power absorbed by the calibrating load may be determined according to any known method, as, for example, by a calorimeter. For purposes of illustration it may be assumed that the calibrating load absorbs 60 watts of power, and that the galvanometer pointer indicates the value of 25 for the resonance load voltage $e_1$. The change in the reading of the galvanometer from the value of 100 to the value of 25 signifies the value of $e_0-e_1$ for the known load of 60 watts and forms the basis for the calibration of the resistance 14. The resistance 14 is then adjusted until the pointer 13 of the galvanometer indicates 60 on the scale 12a, and thus the value registered by the galvanometer corresponds to the known power absorption of the calibrating load. Since the galvanometer now indicates the known power absorption, the resistance of the shunt by this adjustment has been made such as to cause the ratio $$\frac{R_g+R_s}{R_s}$$

(which represents the sensitivity of the galvanometer) to be proportional to $$\frac{1}{R_1}$$

$R_1$ being the equivalent parallel resistance of the load.

The scale 17 is now marked opposite the position of the pointer 18 to indicate the proper position of the wiper 16. The scale 17 for ready reference purposes is marked with the numeral 25 to correspond to the reading of the galvanometer representing the value of $e_1$ before the resistance was adjusted, but it should be understood that this setting of the resistance corresponds to the change in the resonance voltage of the circuit B caused by the introduction of the load represented by the equivalent parallel resistance $R_1$. The galvanometer 12 will register the correct value of the power absorbed by the load for any value of high frequency voltage applied to the circuit B by adjustment of the high frequency source, for instance, by adjustment of the anode voltage of the oscillating tubes of the generator A. Hence any amount of power can be supplied to the load by such adjustment of the high frequency generator A. Once the proper setting of the resistance 14 has been determined from the change in the resonance voltage effected by the introduction of the load, the galvanometer 12 will correctly indicate the power absorption regardless of the value of the power input. Having determined one value of the resistance 14 which converts the galvanometer from a voltage indicating instrument into a correct reading watt meter and marked the location of the wiper on the dial 17, the dial can now be calibrated into proper divisions throughout its range by computation and without the necessity of utilizing other known loads. It is to be understood that the calibrating procedure just described is that which is used in the factory to calibrate the apparatus.

The instrument having been calibrated, the procedure for the measurement of the power absorbed by an unknown load or object placed in the circuit is very simple. The circuit B is tuned to resonance by condenser 4 before the object or load is placed in the circuit, and the output control of generator A so adjusted that the pointer 13 of the galvanometer will indicate a certain reading, for instance, a full scale reading. The voltage applied by the circuit is changed by this adjustment while the frequency is maintained constant. The object is placed between the electrodes, and the circuit B again tuned to resonance. The value registered by the galvanometer is noted, and the wiper 16 of the resistance is then adjusted until the pointer 18 arrives at a mark on the dial 17 corresponding to the value indicated by the galvanometer. The adjustment of the resistance 14 changes the sensitivity of the galvanometer proportionally to the equivalent parallel loss conductance $$\frac{1}{R_1}$$

of the object and causes the galvanometer to register the true value of the power absorbed by the object. Any desired value of power may be administered, or supplied, to the object by so varying the output control generator as to vary the value of the high frequency voltage applied to the circuit B. The correct values of power absorbed by the object will be indicated, no matter what amount of power is supplied to the output circuit B since the circuit remains resonant for the entire run. The resistance 14 is set once for any run; that is, for any particular load or object, and is not thereafter altered during that run, even though the power input, and consequently the power absorption, is varied during the run. Thus any desired amount of power may be administered, or supplied, to the load or object and the value of the power absorbed by the load or object will be indicated in power units by the calibrated meter 12.

In Figure 2 of the drawing there is shown another form of instrumentality. An electronic tube E is bridged across the conductors 1 and 2 of the output circuit and is connected with the moving coil 20 of a galvanometer F of the dynamometer type. The excitation coil 21 of the galvanometer is in the circuit 22 which includes the variable resistance 23 so that the sensitivity of said galvanometer can be varied by adjusting the resistance and thereby the exciting current.

The invention has been described in connection with an indicating device which utilizes the resonant voltages of the circuit, but it is to be understood that indicating devices may be used which utilize resonant current in the circuit as the motivating factor.

I claim:

1. In an apparatus for determining the power absorbed by the load from an oscillatory supply circuit, the combination of a square law measuring device connected across the oscillatory circuit, said device including a meter, the indicating element of which is adapted to be deflected proportionally to the square of the voltage of the oscillatory circuit, and a variable resistance in parallel with the meter of said device for varying the sensitivity of the meter, said resistance being calibrated for adjustment in accordance with the change in the voltage of the oscillatory circuit as indicated by the meter upon the introduction of the load and when so adjusted to proportion the sensitivity of the meter to the equivalent load resistance which is added to the circuit by the load, said meter having a dial calibrated to indicate, upon said adjustment of the resistance, the true value of the power absorbed by the load.

2. An apparatus for measuring the power absorbed by a load from an oscillatory circuit, the combination of a hot wire thermocouple and a galvanometer for measuring the voltage across the circuit, said galvanometer indicating the voltage component of the power absorbed by the load, and a calibrated resistance in parallel with said galvanometer for changing the sensitivity thereof in definite relation to said voltage component of the power absorbed so that the corresponding value of the power absorbed by the load is indicated by the galvanometer, said relation being defined by the formula $$P_1 = E^2 \cdot \frac{1}{R_1}$$

where $E^2$ corresponds to the voltage component of the power absorbed by the load as indicated by the galvanometer prior to the adjustment of the calibrated resistance, and $$\frac{1}{R_1}$$

corresponds to the sensitivity of the galvanometer following the adjustment of the calibrated resistance, $R_1$ corresponds to the equivalent parallel resistance inserted into said circuit by said load, and $P_1$ represents the power absorbed by the load, as indicated by the galvanometer following the adjustment of the calibrated resistance.

3. In an apparatus for determining the power absorbed by a load from an oscillatory circuit, the combination of an electrical device having a square law characteristic, a variable resistance in parallel with said device, said resistance determining the sensitivity of said electrical device, and resistance adjustment means including a scale calibrated to adjust the resistance to a value such that the sensitivity of the device is proportional to the equivalent conductance added to the circuit by the load.

4. The method of measuring the power absorbed by a load from a high frequency output circuit energizing the load, including the steps of impressing upon an electrical measuring instrument a voltage proportional to the square of the no load resonance voltage of said circuit, inserting the load into the circuit and thereby adding an equivalent conductance into the circuit which effects a change in the voltage impressed upon the instrument, and then adjusting the sensitivity of said instrument to a value proportional to said equivalent conductance inserted into the circuit by the load whereby said instrument then indicates a value proportional to the power absorbed.

5. In a device for measuring the power absorbed by a load from a high frequency supply circuit, said device comprising a meter connected to said circuit and calibrated to indicate the change in the voltage of the circuit caused by the addition of the load to the circuit, and adjustment means for determining the sensitivity of said meter, said adjustment means being calibrated to adjust the sensitivity of the meter in accordance with the indicated change in voltage to cause the meter to indicate the power absorbed by the load.

6. In a device for measuring the power absorbed by a load from the output circuit of a high frequency variable power source, said device comprising means for deriving from said circuit an electrical quantity proportional to the voltage across the circuit, electro-responsive measuring means for indicating the value of said quantity, and means for thereafter adjusting the sensitivity of said measuring means according to a previously calibrated factor of proportionality between the indicated value of the quantity and the known power absorption of a calibrating load causing said quantity to be of equal value, whereby said measuring means then indicates the value of the power absorbed by the load for any value of power supplied by said source.

7. In a device for measuring the fractional amount of the total output of power from a high frequency variable power source that is absorbed by the load in the output circuit of said source, said device comprising a variable impedance for tuning the circuit to resonance under no load and load conditions, means for deriving from said circuit unidirectional electrical energizations proportional to the resonance voltages of the circuit under no load and load conditions, electro-responsive measuring means responsive to said electrical energizations and indicating the values of said energizations under no load and load conditions, and means for varying the sensitivity of said measuring means, following the introduction of the load and the retuning of the circuit, in inverse proportion to an equivalent circuit resistance causing equal change in said energizations whereby said electro-responsive measuring means thereafter indicates the value of the power absorbed by the load, and variations thereof as the power supplied by the source is varied.

8. In a device for measuring the power absorbed by a load in the tunable output circuit of a high frequency variable power source, said device comprising means for deriving from said circuit an electrical quantity proportional to the square of the resonance voltage of the circuit under load, electro-responsive measuring means for indicating the value of said quantity, and means for adjusting the sensitivity of the measuring means and calibrated to proportion the sensitivity of said measuring means to an equivalent circuit resistance causing said quantity to be of the same value as that indicated by the measuring means for the particular load, whereby said measuring means indicates the value of the power absorbed by the load for any value of power supplied by said source.

9. In a device for measuring the power absorbed by a load in the tunable output circuit of a high frequency variable power source, said device comprising means for deriving from said circuit no load and load voltages proportional, respectively, to the resonance voltage of the circuit under no load and load conditions, electro-responsive measuring means for indicating the values of said derived voltages, and means for varying the magnitude of the derived load voltage and calibrated to proportion said derived load voltage to the ratio between the change in the indicated values of the derived no load and load voltages and the known power absorption of a calibrating load causing the same change in the derived voltages, whereby said measuring means, following said variation in the magnitude of the derived load voltage, indicates the value of the power absorbed by the load for any value of power supplied by said source.

10. In a device for measuring the power absorbed by a load in the output circuit of a high frequency variable power source, electro-responsive measuring means including a meter for measuring the change in voltage across the output circuit produced by the introduction of the load to provide a calibration number indicative of the equivalent conductance of the load, and means for then presetting the sensitivity of the measuring means according to said calibration number, said means being calibrated to indicate, when its sensitivity is so preset, the value of the power absorbed by the load for any amount of power input.

11. In a device for measuring the power absorbed by a load from a high frequency supply circuit, said device comprising a meter connected to said circuit and calibrated to indicate a value corresponding to the change in the voltage of the circuit caused by the addition of the load to the circuit, and adjustment means for altering the sensitivity of said meter, said adjustment means being calibrated to adjust the sensitivity of the meter in accordance with the indicated value to cause the meter to indicate the power absorbed by the load.

12. In a device for measuring the power absorbed by a load from the output circuit of a high frequency variable power source, said device comprising means for deriving from said circuit an electrical quantity proportional to the voltage across the circuit, electro-responsive measuring means for indicating a value having a mathematical relation to said quantity, and means for thereafter adjusting the sensitivity of said measuring means according to a previously calibrated factor of proportionality between the indicated value and the known power absorption of a calibration load causing an identical indication, whereby said measuring means then indicates the value of the power absorbed by the load for any value of power supplied by said source.

13. In a device for measuring the power absorbed by a load in the tunable output circuit of a high frequency variable power source, said device comprising means for deriving from said circuit an electrical quantity proportional to the square of the resonance voltage of the circuit under load, electro-responsive measuring means for indicating a value proportional to said quantity, and means for adjusting the sensitivity of the measuring means and calibrated to proportion the sensitivity of said measuring means to the value of an equivalent circuit resistance causing said quantity to be of the same value as that indicated by the measuring means for the particular load, whereby said measuring means indicates the value of the power absorbed by the load for any value of power supplied by said source.

14. In a device for measuring the power absorbed by a load in the output circuit of a high frequency variable power source, electro-responsive means including a meter for indicating a value corresponding to the change in voltage across the output circuit produced by the introduction of the load to provide a calibration number indicative of the equivalent conductance of the load, and means for then adjusting the sensitivity of the measuring means according to said calibration number, said means being calibrated to indicate, when its sensitivity is so adjusted, the value of power absorbed by the load for any amount of power input.

15. The method of measuring the power absorbed by a load in a high frequency output circuit energizing the load, including the steps of taking readings on an electrical instrument indicative of the resonant voltages of the circuit before and after inserting the load, adjusting the sensitivity of an electrical instrument indicating a value proportional to the square of the voltage across the circuit in accordance with an index determined from said readings to render the sensitivity of said instrument proportional to the equivalent loss conductance inserted into the high frequency output circuit by said load, said instrument thereby indicating a quantity proportional to the power absorbed by said load.

EUGEN MITTELMANN.